United States Patent
Tai et al.

(10) Patent No.: US 10,824,554 B2
(45) Date of Patent: Nov. 3, 2020

(54) METHOD AND APPARATUS FOR EFFICIENTLY SORTING ITERATION WITH SMALL SORTING SET

(71) Applicant: VIA Technologies, Inc., New Taipei (TW)

(72) Inventors: Ying Yu Tai, Mountain View, CA (US); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 59 days.

(21) Appl. No.: 15/378,044

(22) Filed: Dec. 14, 2016

(65) Prior Publication Data
US 2018/0165010 A1    Jun. 14, 2018

(51) Int. Cl.
G06F 3/06         (2006.01)
G11C 16/34        (2006.01)
G06F 12/02        (2006.01)

(52) U.S. Cl.
CPC .. *G06F 12/0246* (2013.01); *G06F 2212/1024* (2013.01); *G06F 2212/7207* (2013.01); *G06F 2212/7211* (2013.01); *G11C 16/349* (2013.01)

(58) Field of Classification Search
CPC ........ G06F 16/93; G06F 3/1204; G06F 3/126; G06F 12/0246; G06F 16/24542; G06F 16/24568; G06F 16/24578; G06F 16/248; G06F 16/285; G06F 16/335; G06F 16/353; G06F 7/08
USPC ........................... 711/103; 707/752, 999.007
See application file for complete search history.

(56) References Cited

U.S. PATENT DOCUMENTS

| | | | |
|---|---|---|---|
| 6,604,168 B2 | 8/2003 | Ogawa | |
| 8,712,963 B1 * | 4/2014 | Douglis | ............ G06F 11/2056 707/637 |
| 9,967,558 B1 * | 5/2018 | Han | ................... H04N 19/176 |
| 2001/0034809 A1 | 10/2001 | Ogawa | |

(Continued)

FOREIGN PATENT DOCUMENTS

| | | |
|---|---|---|
| CN | 1690983 | 11/2005 |
| CN | 105161137 | 12/2015 |
| EP | 1652338 | 5/2006 |

OTHER PUBLICATIONS

Office Action of Taiwan Counterpart Application, dated Sep. 5, 2018, pp. 1-5.

(Continued)

*Primary Examiner* — Tuan V Thai
*Assistant Examiner* — Edward Waddy, Jr.
(74) *Attorney, Agent, or Firm* — JCIPRNET

(57) ABSTRACT

A non-volatile memory (NVM) apparatus and an iteration sorting method thereof are provided. The NVM apparatus performs the iteration sorting method to select one target block from a plurality of blocks of a NVM, and to perform a management operation on the target block. The iteration sorting method includes: selecting a plurality of candidate blocks among the blocks of the NVM to join into a sorting set, sorting all of the candidate blocks in the sorting set according to metadata, picking one candidate block with maximum (or minimum) metadata from the sorting set to serve as the target block, and keeping M candidate blocks in the sorting set and discarding the rest of the candidate blocks from the sorting set.

10 Claims, 5 Drawing Sheets

(56) References Cited

U.S. PATENT DOCUMENTS

| | | | |
|---|---|---|---|
| 2008/0235433 A1* | 9/2008 | Chen | G06F 12/0246 |
| | | | 711/100 |
| 2009/0292704 A1* | 11/2009 | Chen | G06F 16/244 |
| 2010/0174845 A1* | 7/2010 | Gorobets | G06F 12/0246 |
| | | | 711/103 |
| 2013/0102343 A1 | 4/2013 | Shaw | |
| 2014/0215129 A1* | 7/2014 | Kuzmin | G06F 12/0246 |
| | | | 711/103 |
| 2015/0278299 A1* | 10/2015 | Kim | G06F 7/36 |
| | | | 707/752 |
| 2018/0018158 A1* | 1/2018 | Kalke | G06F 8/65 |

OTHER PUBLICATIONS

"Office Action of China Counterpart Application," dated Jun. 17, 2019, p. 1-p. 9.

* cited by examiner

METHOD AND APPARATUS FOR EFFICIENTLY SORTING ITERATION WITH SMALL SORTING SET

BACKGROUND OF THE INVENTION

Field of the Invention

The invention relates to a memory apparatus, and in particular, a non-volatile memory (NVM) apparatus and an iteration sorting method thereof.

Description of Related Art

Compared with conventional hard disk drives, since a flash memory storage device has good read/write performance and has low power consumption, the flash memory is widely used in data storage systems. The flash translation layer (FTL) is the core part in a flash memory-type storage device. The FTL is not only responsible for scheduling data path tasks (namely, relevant to performance) but also manages reliability (namely, relevant to durability) of the flash memory. The FTL is conventional art and thus is not repeatedly described here.

FTL operations (e.g., wear leveling, garbage collection, or patrol read) are performed by using some metadata from a plurality of blocks of the storage device. Each of the blocks respectively includes different metadata to record its own management information or count value of the block. For example, the metadata of each block may include a program/erase count, an invalid data count, and a time stamp. Whenever the FTL is required to perform wear leveling, garbage collection, or patrol read, the metadata (i.e., the blocks) need to be sorted (or at least the maximum or minimum value needs to be found). How to find the maximum value (or minimum value) of the metadata, or sort the metadata, is an important issue.

SUMMARY OF THE INVENTION

The invention provides a non-volatile memory (NVM) apparatus and an iteration sorting method thereof for selecting one target block among a plurality of candidate blocks to perform a management operation.

One embodiment of the invention provides a NVM apparatus. The NVM apparatus includes a NVM and a controller. The NVM includes a plurality of blocks. The controller is coupled to the NVM. The controller is configured to perform an iteration sorting method to select one target block among K candidate blocks of the blocks and to perform a management operation on the target block. The iteration sorting method includes: arbitrarily selecting (N−M) candidate blocks among the K candidate blocks to join into a sorting set, sorting all of the candidate blocks in the sorting set according to metadata, picking one candidate block with maximum metadata or minimum metadata from the sorting set after sorting to serve as the target block, and keeping M candidate blocks in the sorting set after picking the target block from the sorting set and discarding the rest of the candidate blocks from the sorting set, wherein K, M, and N are integers and K>N>M.

One embodiment of the invention provides an iteration sorting method of a NVM apparatus for selecting one target block among K candidate blocks of a plurality of blocks to perform a management operation on the target block. The iteration sorting method includes the following steps: arbitrarily selecting (N−M) candidate blocks among the K candidate blocks to join into a sorting set; sorting all of the candidate blocks in the sorting set according to metadata; after sorting, picking one candidate block with maximum metadata or minimum metadata from the sorting set to serve as the target block; and after picking the target block from the sorting set, keeping M candidate blocks in the sorting set and discarding the rest of the candidate blocks from the sorting set, wherein K, M, and N are integers and K>N>M.

In light of the above, the NVM apparatus and the iteration sorting method thereof provided by the embodiments of the invention are capable of keeping M candidate blocks of a previous iteration in a sorting set, arbitrarily selecting (N−M) blocks among a plurality of blocks of the NVM apparatus to join into the sorting set, and sorting all of the blocks in the sorting set according to metadata. Through finding the maximum value/minimum value block based on the iterative sampling method and then performing a management operation, the number of blocks in the sorting set can be far smaller than the number of blocks of the NVM apparatus. Compared with conventional solutions, due to smaller room for sorting, the complexity is much lower and the search delay is smaller.

To provide a further understanding of the aforementioned and other features and advantages of the invention, exemplary embodiments, together with the reference drawings, are described in detail below.

DESCRIPTION OF THE EMBODIMENTS

Throughout the text of the specification (including the claims), the term "couple (or connect)" refers to any direct or indirect connection means. For example, where a first device is described to be coupled (or connected) to a second device in the text, it should be interpreted that the first device may be directly connected to the second device, or that the first device may be indirectly connected to the second device through another device or some connection means. Moreover, wherever applicable, elements/components/steps referenced by the same numerals in the figures and embodiments refer to the same or similar parts. Elements/components/steps referenced by the same numerals or the same language in different embodiments may be mutually referred to for relevant descriptions.

Figure 1:
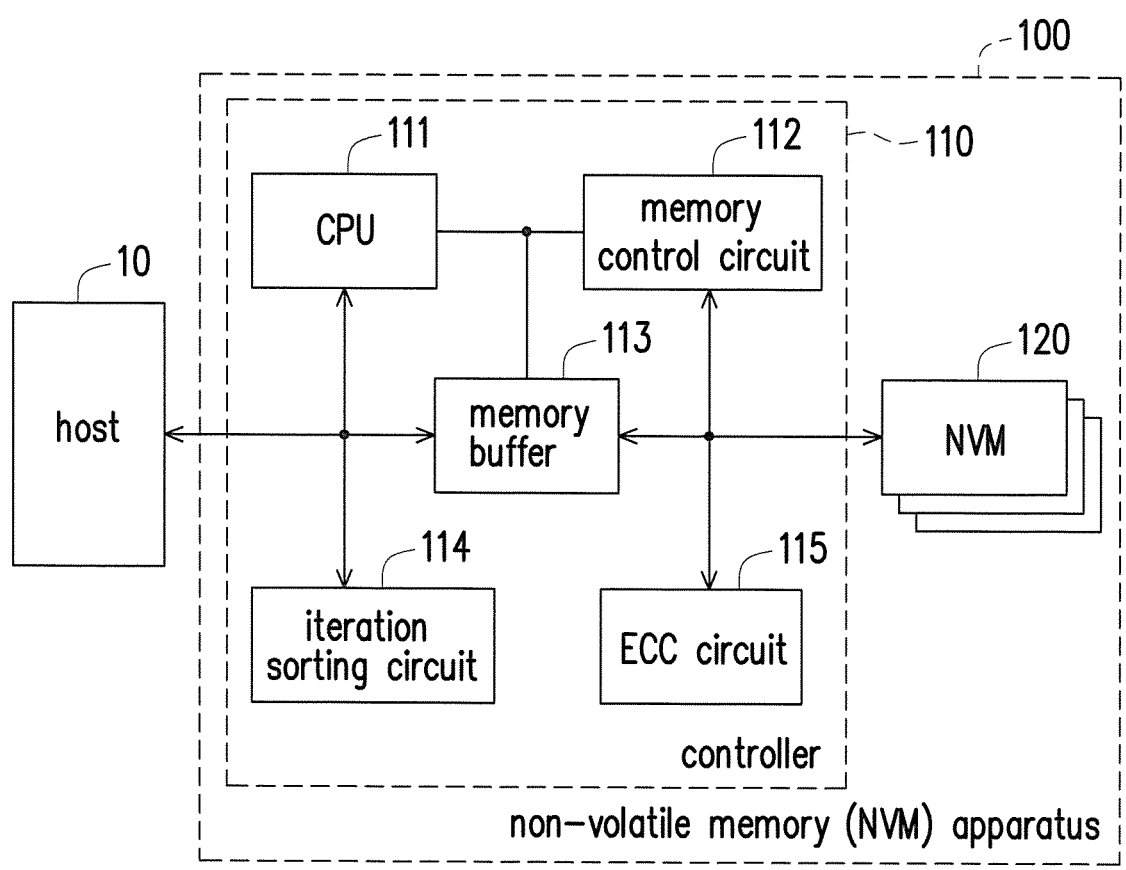
FIG. 1 is a circuit block diagram illustrating a non-volatile memory (NVM) apparatus according to one embodiment of the invention.

FIG. 1 is a circuit block diagram illustrating a non-volatile memory (NVM) apparatus 100 according to one embodiment of the invention. According to the design needs, the NVM apparatus 100 may be a flash drive, a solid state disc (SSD), or another storage apparatus. The NVM apparatus 100 may be coupled to a host 10. The host 10 may be a computer, a handheld phone, a multimedia player, a camera, or another electronic device. The NVM apparatus 100 includes a controller 110 and a NVM 120. According to the design needs, the NVM 120 may be a NAND flash memory or another non-volatile storage circuit/device. The NVM 120 includes a plurality of blocks for storing data.

The controller 110 is coupled to the NVM 120. The controller 110 may access the NVM 120 according to a logical address of a write command of the host 10. In some embodiments, the logical address information may be a logical block address (LBA) or another logical address. When the host 10 sends a write command to the NVM apparatus 100, the controller 110 converts (or decodes) the host write command into a plurality of internal write commands/instructions. The so-called "converting one host write command into a plurality of internal write commands/instructions" is write amplification (WA). The WA is mainly used for an internal write operation, such as garbage collection, wear leveling, and/or other management write operations, for managing data update and storage endurance. Moreover, the controller 110 may perform other management operations on accessing the NVM 120, such as patrol read or other flash translation layer (FTL) operations. The management operations (e.g., wear leveling, garbage collection, or patrol read) are conventional art and shall not be repeatedly described here.

The management operations usually require some metadata from the plurality of blocks of the NVM 120. Each of the blocks respectively includes different metadata to record its own management information or count values of the block. For example, the metadata of each block may include a program/erase count, an invalid data count, and a time stamp. Whenever the controller 110 is required to perform a management operation (e.g., wear leveling, garbage collection, or patrol read), the metadata (i.e., the blocks) need to be sorted (or at least the maximum or minimum value needs to be found), so as to find one target block among the blocks. The controller 110 may also perform an "iteration sorting method" on accessing the NVM 120 to select one target block among K candidate blocks of the NVM 120 and to perform the management operation on the target block (to be detailed below).

In the embodiment illustrated in FIG. 1, the controller 110 includes a central processing unit (CPU) 111, a memory control circuit 112, a memory buffer 113, an iteration sorting circuit 114, and an error checking and correcting (hereinafter referred to as ECC) circuit 115. The CPU 111 is coupled to the host 10 through a communication interface. According to the design needs, the communication interface includes a small computer system interface (SCSI), a serial attached SCSI (SAS), an enhanced small disk interface (ESDI), a serial advanced technology attachment (SATA), a peripheral component interconnect express (PCI-express), an integrated drive electronics (IDE) interface, a universal serial bus (USB), a thunderbolt interface, or another interface. The present embodiment does not limit the interface structure between the host 10 and the NVM apparatus 100.

When the host 10 sends the write command, data to be written may be temporarily stored in the memory buffer 113, and the CPU 111 converts/decodes the write command (including the logical address) of the host 10 into a corresponding internal control signal (including a physical address of the NVM 120) and provides the internal control signal to the memory control circuit 112 and/or the memory buffer 113. The memory buffer 113 is, for example, a dynamic random access memory (DRAM), a static random access memory (SRAM), or another volatile memory. The ECC circuit 115 may execute an ECC algorithm to encode the data temporarily stored in the memory buffer 113 into a codeword. In some embodiments, the ECC circuit 115 may execute a Bose-Chaudhuri-Hocquengh (BCH) code algorithm, a low density parity check (LDPC) code algorithm, or another ECC algorithm. According to the internal control signal, the memory control circuit 112 may address/control the NVM 120 to write the codeword into the NVM 120.

When the host 10 sends a read command, the CPU 111 converts/decodes the read command (including a logical address) of the host 10 into a corresponding internal control signal (including the physical address of the NVM 120). According to the internal control signal, the memory control circuit 112 may address/control the NVM 120 to read the codeword from the NVM 120. The ECC circuit 115 may execute the ECC algorithm to decode the codeword into data and temporarily store the decoded data in the memory buffer 113. Then, the CPU 111 may transmit the data temporarily stored in the memory buffer 113 back to the host 10.

Figure 2:
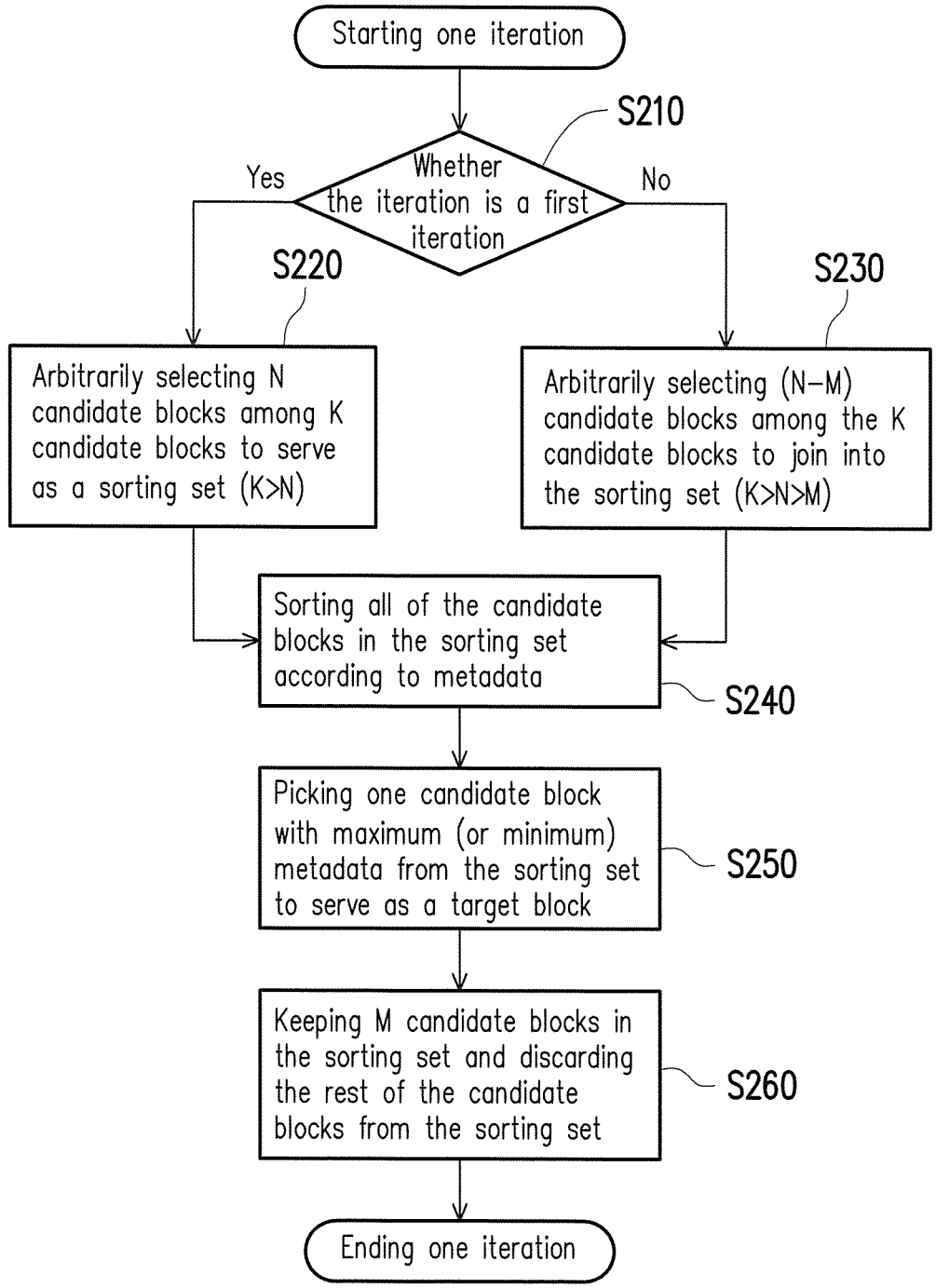
FIG. 2 is a flowchart illustrating an iteration sorting method according to one embodiment of the invention.

The iteration sorting circuit 114 of the controller 110 may perform an "iteration sorting method" on accessing the NVM 120 to select one target block among K candidate blocks of the NVM 120. According to the target block selected by the iteration sorting circuit 114, the CPU 111 may perform a management operation on the target block. For example, FIG. 2 is a flowchart illustrating an iteration sorting method according to one embodiment of the invention. The concept provided by the present embodiment relates to finding the maximum value/minimum value block through an iterative sampling method. The flowchart of FIG. 2 illustrates each step of one iteration. Referring to FIG. 1 and FIG. 2, in step S210, the iteration sorting circuit 114 of the controller 110 determines whether the iteration is a first iteration. If the iteration is determined in step S210 to be the first iteration, the iteration sorting circuit 114 proceeds to step S220. If the iteration is determined in step S210 not to be the first iteration, the iteration sorting circuit 114 proceeds to step S230.

In step S220, the iteration sorting circuit 114 of the controller 110 arbitrarily selects N candidate blocks among K candidate blocks of the NVM 120 to serve as a sorting set, wherein K and N are integers and K>N. In step S230, the iteration sorting circuit 114 of the controller 110 arbitrarily selects (N−M) candidate blocks among the K candidate blocks of the NVM 120 to join into the sorting set, wherein M is an integer and K>N>M. The present embodiment does not limit the implementation of "arbitrary selection" in step S220 and step S230. For example (but not limited hereto), the "arbitrary selection" may be selecting one or more candidate blocks among a plurality of blocks by using any random algorithm.

The definition for the K candidate blocks is a partial block set among all of the blocks of the NVM 120 that are appropriate for performing a specific management operation. The iteration sorting circuit 114 may select one target block among the K candidate blocks, and the CPU 111 may perform the management operation on the target block. For example, when the management operation is a wear leveling operation, the K candidate blocks are all of free blocks among all of the blocks of the NVM 120. When the management operation is a garbage collection operation, the K candidate blocks are all of closed blocks (or fully written blocks) among all of the blocks of the NVM 120. When the management operation is a patrol read operation, the K candidate blocks are all of the closed blocks among all of the blocks of the NVM 120.

In step S240, the iteration sorting circuit 114 of the controller 110 sorts all of the candidate blocks in the sorting set according to the metadata. The present embodiment does not limit the implementation of the sorting operation in step S240. For example, the iteration sorting circuit 114 may adopt any sorting algorithm to sort all of the candidate blocks in the sorting set according to the metadata. The number N of the candidate blocks in the sorting set may be far smaller than the number K of all of the candidate blocks of the NVM 120. The number N may be determined by the design needs. For example, the number K of all of the candidate blocks of the NVM 120 may be several millions (or more), and the number N of the candidate blocks in the sorting set may be smaller than 10 or may be several tens (e.g., N=30). Compared with conventional solutions, due to smaller room for sorting, the complexity is much lower and the search delay is smaller.

According to the needs of the management operation, the sorting operation in step S240 may be incremental sorting or decremental sorting. For example, when the management operation is the wear leveling operation, the metadata in step S240 are program/erase counts, and the sorting operation in step S240 may be incremental sorting. When the management operation is the garbage collection operation, the metadata in step S240 are invalid data counts, and the sorting operation in step S240 may be decremental sorting. When the management operation is the patrol read operation, the metadata in the step S240 are time stamps, and the sorting operation in step S240 may be incremental sorting.

In step S250, the iteration sorting circuit 114 of the controller 110 picks one candidate block with maximum metadata (or minimum metadata) from the sorting set to serve as the target block. For example, when the management operation is the wear leveling operation, in step S250, one candidate block with minimum metadata (a minimum program/erase count) is picked from the sorting set to serve as the target block. When the management operation is the garbage collection operation, in step S250, one candidate block with maximum metadata (a maximum invalid data count) is picked from the sorting set to serve as the target block. When the management operation is the patrol read operation, in step S250, one candidate block with minimum metadata (an earliest time stamp) is picked from the sorting set to serve as the target block. Accordingly, the CPU 111 of the controller 110 may perform the management operations on the target block.

In step S260, the iteration sorting circuit 114 of the controller 110 keeps M candidate blocks in the sorting set and discards the rest of the candidate blocks from the sorting set. The number M may be determined by the design needs. In step S260, M candidate blocks with the maximum metadata (or the minimum metadata) may be kept in the sorting set. For example, when the management operation is the wear leveling operation, in step S260, M candidate blocks with the minimum metadata (the minimum program/erase counts) are kept in the sorting set. When the management operation is the garbage collection operation, in step S260, M candidate blocks with the maximum metadata (the maximum invalid data counts) are kept in the sorting set. When the management operation is the patrol read operation, in step S260, M candidate blocks with the minimum metadata (the earliest time stamps) are kept in the sorting set.

For example, FIG. 3A to FIG. 3E and FIG. 4A to FIG. 4E are schematic diagrams illustrating the sorting set SS in a process of an iteration sorting method based on wear leveling as an applied example. In the embodiment illustrated in FIG. 3A to FIG. 3E and FIG. 4A to FIG. 4E, the number N of the candidate blocks in the sorting set SS is set at 8, and the number M of the kept candidate blocks in the sorting set is set at 2. According to the design needs, in other embodiments, the number N and/or the number M may be set at other values.

Figure 3:
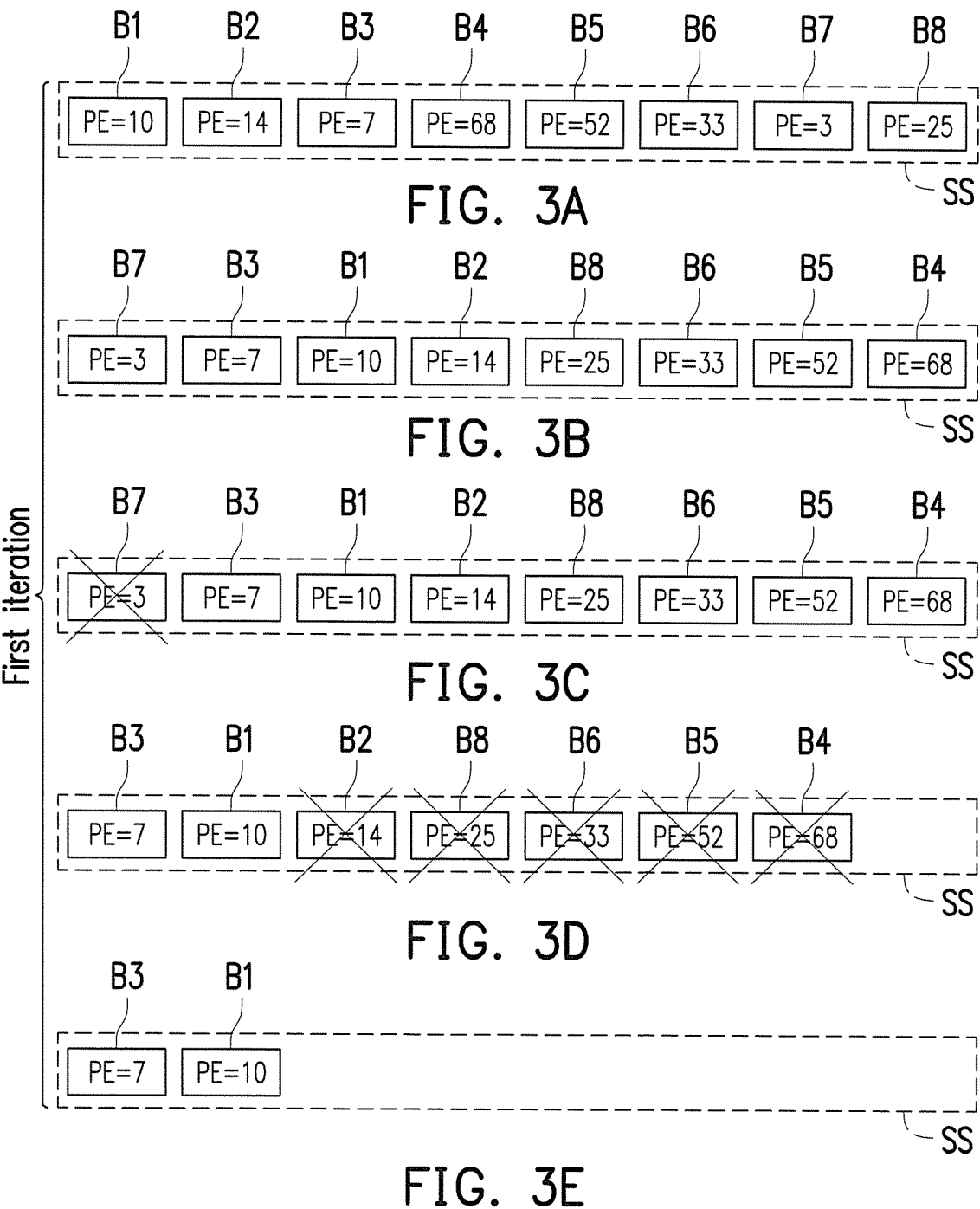
FIG. 3A to FIG. 3E and FIG. 4A to FIG. 4E are schematic diagrams illustrating the sorting set SS in a process of an iteration sorting method based on wear leveling as an applied example.

FIG. 3A to FIG. 3E illustrate a process of the controller 110 performing a first iteration. When the sorting set SS does not include valid candidate blocks, or after the NVM apparatus 100 is initialized, the iteration sorting circuit 114 may proceed with step S220 to arbitrarily select N candidate blocks among K candidate blocks of the NVM 120 to serve as the sorting set SS. Referring to FIG. 3A, the iteration sorting circuit 114 arbitrarily selects 8 candidate blocks (e.g., candidate blocks B1 to B8 illustrated in FIG. 3A) among the K candidate blocks of the NVM 120 to serve as the sorting set SS. Specifically, supposing that a program/erase count PE (metadata) of the candidate block B1 is 10, a program/erase count PE of the candidate block B2 is 14, a program/erase count PE of the candidate block B3 is 7, a program/erase count PE of the candidate block B4 is 68, a program/erase count PE of the candidate block B5 is 52, a program/erase count PE of the candidate block B6 is 33, a program/erase count PE of the candidate block B7 is 3, and a program/erase count PE of the candidate block B8 is 25.

Referring to FIG. 3B, in step S240, the iteration sorting circuit 114 of the controller 110 sorts all of the candidate blocks B1 to B8 in the sorting set SS according to the program/erase counts PE (incremental sorting).

Referring to FIG. 3C, in step S250, the iteration sorting circuit 114 of the controller 110 picks one candidate block with the minimum program/erase count PE from the sorting set SS to serve as the target block. In the embodiment illustrated in FIG. 3C, the candidate block B7 is the candidate block with the minimum program/erase count PE in the sorting set SS. Accordingly, the iteration sorting circuit 114 picks the candidate block B7 from the sorting set SS to serve as the target block. The CPU 111 in the controller 110 may perform the wear leveling operation (management operation) on the candidate block B7 (target block).

Referring to FIG. 3D, in step S260, the iteration sorting circuit 114 of the controller 110 keeps 2 candidate blocks in the sorting set SS and discards the rest of the candidate blocks from the sorting set SS. In the embodiment illustrated in FIG. 3D, in step S260, the 2 candidate blocks B3 and B1 with the minimum program/erase counts PE (metadata) are kept in the sorting set SS. The rest of the candidate blocks B2, B8, B6, B5, and B4 in the sorting set SS are discarded.

FIG. 3E illustrates the sorting set SS from which the rest of the candidate blocks have been discarded. In the embodiment illustrated in FIG. 3E, the candidate blocks B3 and B1 are kept in the sorting set SS. In some embodiments, the sorting set SS keeping the candidate blocks B3 and B1 illustrated in FIG. 3E may be stored in the NVM 120. In other embodiments, the sorting set SS keeping the candidate blocks B3 and B1 illustrated in FIG. 3E may be stored in a volatile memory (e.g., the memory buffer 113 or another random access memory). Before power loss, the sorting set SS stored in the volatile memory may be stored to the NVM 120 to preserve the sorting set SS keeping the candidate blocks B3 and B1 illustrated in FIG. 3E during the power loss. After the power loss, the sorting set SS in the volatile memory will be lost. When power is on next time, the iteration sorting circuit 114 of the controller 110 may choose to use (or not to use) the sorting set SS of the candidate blocks kept in the NVM 120. If the system chooses not to use the sorting set SS in the NVM 120, after power is on, the iteration sorting circuit 114 will perform the first iteration process of the foregoing iteration sorting method again. If the system chooses to use the sorting set SS in the NVM 120, after power is on, the iteration sorting circuit 114 will retrieve the sorting set SS keeping the candidate blocks B3 and B1 illustrated in FIG. 3E from the NVM 120 for use in the next iteration.

FIG. 4A to FIG. 4E illustrate a process of the controller 110 performing a second iteration. When the wear leveling operation (management operation) is performed again, the foregoing iteration sorting method is executed again. When the sorting set SS includes valid candidate blocks, the iteration sorting circuit 114 proceeds with step S230 to arbitrarily select (N−M) candidate blocks among the K candidate blocks of the NVM 120 to join into the sorting set SS. For example, referring to FIG. 4A, the iteration sorting circuit 114 arbitrarily selects 6 (i.e., N−M) candidate blocks (e.g., candidate blocks B9 to B14 illustrated in FIG. 4A) among the K candidate blocks of the NVM 120 to join into the sorting set SS. Specifically, supposing that a program/erase count PE (metadata) of the candidate block B9 is 61, a program/erase count PE of the candidate block B10 is 9, a program/erase count PE of the candidate block B11 is 4, a program/erase count PE of the candidate block B12 is 29, a program/erase count PE of the candidate block B13 is 12, and a program/erase count PE of the candidate block B14 is 23.

Figure 4:
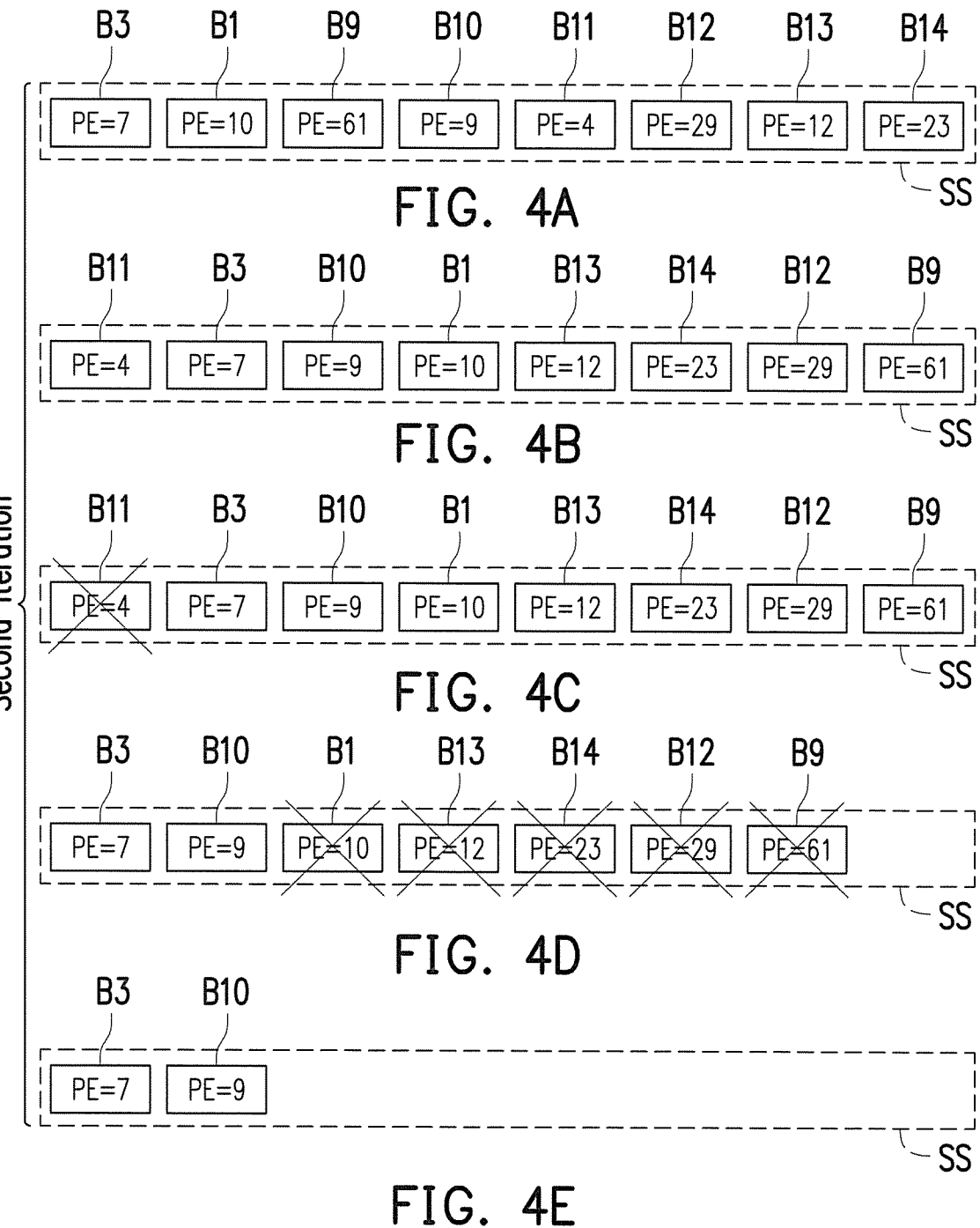

Referring to FIG. 4B, in step S240, the iteration sorting circuit 114 of the controller 110 sorts all of the candidate blocks B3, B1, and B9 to B14 in the sorting set SS according to the program/erase counts PE (incremental sorting).

Referring to FIG. 4C, in step S250, the iteration sorting circuit 114 of the controller 110 picks one candidate block with the minimum program/erase count PE from the sorting set SS to serve as the target block. In the embodiment illustrated in FIG. 4C, the candidate block B11 in the candidate block with the minimum program/erase count PE in the sorting set SS. Accordingly, the iteration sorting circuit 114 picks the candidate block B11 from the sorting set SS to serve as the target block. The CPU 111 of the controller 110 may perform the wear leveling operation (management operation) on the candidate block B11 (target block).

Referring to FIG. 4D, in step S260, the iteration sorting circuit 114 of the controller 110 keeps 2 candidate blocks in the sorting set SS and discards the rest of the candidate blocks from the sorting set SS. In the embodiment illustrated in FIG. 4D, in step S260, the candidate blocks B3 and B10 with the minimum program/erase counts PE (metadata) are kept in the sorting set SS. The rest of the candidate blocks B1, B13, B14, B12, and B9 in the sorting set SS are discarded.

FIG. 4E illustrates the sorting set SS from which the rest of the candidate blocks have been discarded. In the embodiment illustrated in FIG. 4E, the candidate blocks B3 and B10 are kept in the sorting set SS for use in the next iteration. In the same way, when the FTL needs to perform wear leveling, the foregoing iteration process will be repetitively performed.

It shall be noted that, in different applied situations, the relevant functions of the above-described controller 110, CPU 111, memory control circuit 112, iteration sorting circuit 114 and/or ECC circuit 115 may be implemented as software, firmware, or hardware by utilizing common programming languages (e.g., C or C++), hardware description languages (e.g., Verilog HDL or VHDL), or other adequate programming languages. The software (or the firmware) capable of executing the relevant functions can be arranged into any known computer-accessible media such as magnetic tapes, semiconductor memories, magnetic disks, or compact disks (e.g., CD-ROM or DVD-ROM); or the software (or the firmware) may be transmitted via the Internet, a wired communication, a wireless communication, or other communication media. The software (or the firmware) may be stored in the computer-accessible media, so that a computer processor can access/execute programming codes of the software (or the firmware). In addition, the apparatus and the method of the invention can also be implemented by a combination of hardware and software.

Figure 5:
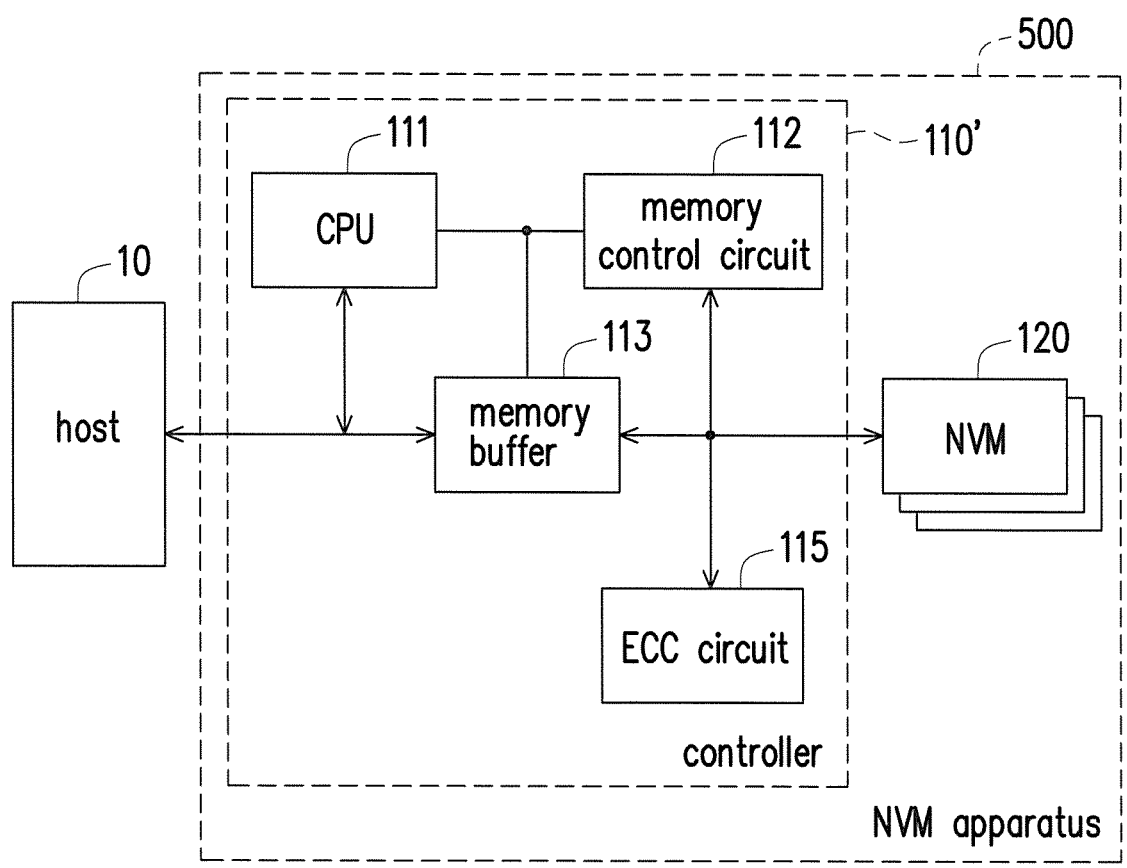
FIG. 5 is a circuit block diagram illustrating a NVM apparatus according to another embodiment of the invention.

For example, FIG. 5 is a circuit block diagram illustrating a NVM apparatus 500 according to another embodiment of the invention. The NVM apparatus 500 includes a controller 110' and a NVM 120. In the embodiment illustrated in FIG. 5, the controller 110' includes a CPU 111, a memory control circuit 112, a memory buffer 113, and an ECC circuit 115. The NVM apparatus 500, the controller 110', the NVM 120, the CPU 111, the memory control circuit 112, the memory buffer 113, and the ECC circuit 115 illustrated in FIG. 5 can be analogously inferred by referring to relevant descriptions of the NVM apparatus 100, the controller 110, the NVM 120, the CPU 111, the memory control circuit 112, the memory buffer 113, and the ECC circuit 115 illustrated in FIG. 1 and shall not be repeatedly described here. In the embodiment illustrated in FIG. 5, the iteration sorting circuit 114 is omitted, and the function of the iteration sorting circuit 114 may be implemented in the CPU 111 by using firmware and/or software.

In summary of the above, the NVM apparatus and the iteration sorting method thereof described in the embodiments of the invention are capable of keeping M candidate blocks of a previous iteration in a sorting set SS. When a management operation is performed again, the NVM apparatus arbitrarily selects (N−M) candidate blocks among a plurality of candidate blocks of the NVM 120 to join into the sorting set SS and sorts all of the candidate blocks in the sorting set SS according to metadata. After sorting, the NVM apparatus picks one candidate block with maximum (or minimum) metadata from the sorting set SS to serve as a target block, so as to perform a management operation on the target block. After the target block is picked from the sorting set SS, the NVM apparatus keeps M candidate blocks in the sorting set SS and discards the rest of the candidate blocks from the sorting set SS. The sorting set SS keeping the M candidate blocks may be preserved for use in the next iteration. Through finding the maximum value/minimum value block based on the iterative sampling method, the number of blocks in the sorting set SS can be far smaller than the number of blocks of the NVM 120. Compared with conventional solutions, due to smaller room for sorting, the complexity is much lower and the search delay is smaller.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A non-volatile memory apparatus comprising:
a non-volatile memory comprising a plurality of blocks; and
a controller, coupled to the non-volatile memory, configured to perform an iteration sorting method to determine one target block among K candidate blocks of the blocks of the non-volatile memory and to perform a management operation on the target block, wherein the iteration sorting method comprises:
  picking kept candidate blocks with a quantity of M from a preceding iteration processed by a first sorting operation to join into a sorting set so as to perform a second sorting operation, wherein M is an integer larger than 1;
  selecting candidate blocks with a quantity of N minus M among the K candidate blocks to join into the sorting set so as to perform the second sorting operation, wherein K and N are integers, N is a total quantity of the candidate blocks in the sorting set, K is larger than N, and the value of (N minus M) is larger than 1;
  performing the second sorting operation by sorting all of the candidate blocks in the sorting set based on metadata corresponding to each of the candidate blocks in the sorting set;
  picking one candidate block with maximum metadata or minimum metadata to serve as the target block from the sorting set after sorting all of the candidate blocks in the sorting set; and
  selecting M candidate blocks from remaining blocks in the sorting set processed by the second sorting operation after picking the target block and discarding non-selected candidate blocks from the sorting set, so that the M candidate blocks serve as part of a new sorting set for a next iteration.

2. The non-volatile memory apparatus according to claim 1, wherein the iteration sorting method further comprises: arbitrarily selecting N candidate blocks among the K candidate blocks to serve as a first sorting set in a first iteration.

3. The non-volatile memory apparatus according to claim 1, wherein when the management operation is a wear leveling operation, the K candidate blocks are all of free blocks among the blocks of the non-volatile memory, the metadata are program/erase counts, the controller picks one candidate block with a minimum program/erase count from the sorting set to serve as the target block, and the controller selects the M candidate blocks with minimum program/erase counts from the remaining blocks in the sorting set after picking the target block and discards the non-selected candidate blocks from the sorting set.

4. The non-volatile memory apparatus according to claim 1, wherein when the management operation is a garbage collection operation, the K candidate blocks are all of closed blocks among the blocks of the non-volatile memory, the metadata are invalid data counts, the controller picks one candidate block with a maximum invalid data count from the sorting set to serve as the target block, and the controller selects the M candidate blocks with maximum invalid data counts from the remaining blocks in the sorting set after picking the target block and discards the non-selected candidate blocks from the sorting set.

5. The non-volatile memory apparatus according to claim 1, wherein when the management operation is a patrol read operation, the K candidate blocks are all of closed blocks among the blocks of the non-volatile memory, the metadata are time stamps, the controller picks one candidate block with an earliest time stamp from the sorting set to serve as the target block, and the controller selects the M candidate blocks with earliest time stamps from the remaining blocks in the sorting set after picking the target block and discards the non-selected candidate blocks from the sorting set.

6. An iteration sorting method of a non-volatile memory apparatus for determining one target block among K candidate blocks of a plurality of blocks of a non-volatile memory to perform a management operation on the target block, the iteration sorting method comprising:
  picking kept candidate blocks with a quantity of M from a preceding iteration processed by a first sorting operation to join into a sorting set so as to perform a second sorting operation, wherein M is an integer larger than 1;
  selecting candidate blocks with a quantity of N minus M among the K candidate blocks to join into the sorting set so as to perform the second sorting operation, wherein K and N are integers, N is a total quantity of the candidate blocks in the sorting set, K is larger than N, and the value of (N minus M) is larger than 1;
  performing the second sorting operation by sorting all of the candidate blocks in the sorting set based on metadata corresponding to each of the candidate blocks in the sorting set;
  picking one candidate block with maximum metadata or minimum metadata to serve as the target block from the sorting set after sorting all of the candidate blocks in the sorting set; and
  selecting M candidate blocks from remaining blocks in the sorting set processed by the second sorting operation after picking the target block and discarding non-selected candidate blocks from the sorting set, so that the M candidate blocks serve as part of a new sorting set for a next iteration.

7. The iteration sorting method according to claim 6, further comprising:
  in a first iteration, arbitrarily selecting N candidate blocks among the K candidate blocks to serve as a first sorting set.

8. The iteration sorting method according to claim 6, wherein when the management operation is a wear leveling operation, the K candidate blocks are all of free blocks among the blocks of the non-volatile memory, the metadata are program/erase counts, the step of picking one candidate block with the maximum metadata or minimum metadata to serve as the target block from the sorting set is picking one candidate block with a minimum program/erase count from the sorting set to serve as the target block, and the step of selecting the M candidate blocks from the remaining blocks in the sorting set after picking the target block is selecting the M candidate blocks with minimum program/erase counts from the remaining blocks in the sorting set after picking the target block.

9. The iteration sorting method according to claim 6, wherein when the management operation is a garbage collection operation, the K candidate blocks are all of closed blocks among the blocks of the non-volatile memory, the metadata are invalid data counts, the step of picking one candidate block with the maximum metadata or minimum metadata to serve as the target block from the sorting set is picking one candidate block with a maximum invalid data count from the sorting set to serve as the target block, and the step of selecting the M candidate blocks from the remaining blocks in the sorting set after picking the target block is selecting the M candidate blocks with maximum invalid data counts from the remaining blocks in the sorting set after picking the target block.

10. The iteration sorting method according to claim 6, wherein when the management operation is a patrol read operation, the K candidate blocks are all of closed blocks among the blocks of the non-volatile memory, the metadata are time stamps, the step of picking one candidate block with the maximum metadata or minimum metadata to serve as the target block from the sorting set is picking one candidate block with an earliest time stamp from the sorting set to serve as the target block, and the step of selecting the M candidate blocks from the remaining blocks in the sorting set after picking the target block is selecting the M candidate blocks with earliest time stamps from the remaining blocks in the sorting set after picking the target block.

* * * * *